(12) United States Patent
Okada et al.

(10) Patent No.: US 7,803,464 B2
(45) Date of Patent: *Sep. 28, 2010

(54) SURFACE-COATED CUTTING TOOL

(75) Inventors: Yoshio Okada, Itami (JP); Naoya Omori, Itami (JP); Minoru Itoh, Itami (JP); Norihiro Takanashi, Itami (JP); Shinya Imamura, Itami (JP); Susumu Okuno, Itami (JP)

(73) Assignee: Sumitomo Electric Hardmetal Corp., Hyogo (JP)

( * ) Notice: Subject to any disclaimer, the term of this patent is extended or adjusted under 35 U.S.C. 154(b) by 365 days.

This patent is subject to a terminal disclaimer.

(21) Appl. No.: 11/794,257

(22) PCT Filed: Nov. 16, 2005

(86) PCT No.: PCT/JP2005/020995

§ 371 (c)(1),
(2), (4) Date: Jun. 27, 2007

(87) PCT Pub. No.: WO2006/070538

PCT Pub. Date: Jul. 6, 2006

(65) Prior Publication Data

US 2008/0292905 A1 Nov. 27, 2008

(30) Foreign Application Priority Data

Dec. 27, 2004 (JP) ................ 2004-377489

(51) Int. Cl.
*B32B 9/00* (2006.01)
(52) U.S. Cl. .............. 428/469; 428/472; 428/698; 428/701; 428/702
(58) Field of Classification Search ............ 428/216, 428/325, 336, 629, 697, 698, 699, 701, 702; 51/307, 309; 407/20, 29, 54, 107, 113, 114, 407/115, 116, 117, 118, 119
See application file for complete search history.

(56) References Cited

U.S. PATENT DOCUMENTS

| 5,395,680 | A | * | 3/1995 | Santhanam et al. | ......... 428/212 |
| 5,516,588 | A | * | 5/1996 | van den Berg et al. | ...... 428/469 |
| 5,681,651 | A | * | 10/1997 | Yoshimura et al. | ......... 428/216 |

(Continued)

FOREIGN PATENT DOCUMENTS

JP 5-177411 7/1993

(Continued)

OTHER PUBLICATIONS

Machine Translation of Yoshimura et al., JP 06-055311 A, Mar. 1, 1994.*

*Primary Examiner*—Timothy M Speer
(74) *Attorney, Agent, or Firm*—McDermott Will & Emery LLP

(57) ABSTRACT

A surface-coated cutting tool comprising a substrate, and a coating formed thereon, characterized in that the coating includes a first coating containing TiCN and a second coating containing α-type $Al_2O_3$, the first coating is interposed between the substrate and the second coating, and the second coating has compressive stress S1 on the rake face and tensile stress S2 on the flank face, with the compressive stress S1 and the tensile stress S2 being defined by the following expression;

441 MPa$\leq |S1-S2| \leq$3500 MPa.

8 Claims, 1 Drawing Sheet

U.S. PATENT DOCUMENTS

| | | | |
|---|---|---|---|
| 5,861,210 A * | 1/1999 | Lenander et al. | 428/336 |
| 5,981,078 A * | 11/1999 | Tabersky et al. | 428/457 |
| 5,985,427 A * | 11/1999 | Ueda et al. | 428/216 |
| 6,187,421 B1 * | 2/2001 | Moriguchi et al. | 428/216 |
| 6,251,508 B1 * | 6/2001 | Ruppi | 428/216 |
| 2002/0187370 A1 | 12/2002 | Yamagata et al. | |

FOREIGN PATENT DOCUMENTS

| | | |
|---|---|---|
| JP | 5-177412 | 7/1993 |
| JP | 5-177413 | 7/1993 |
| JP | 6-55311 | 3/1994 |
| JP | 6-79502 | 3/1994 |
| JP | 10-15707 | 1/1998 |
| JP | 2003-094230 | 4/2003 |
| WO | WO 02/04156 A1 | 1/2002 |

* cited by examiner

SURFACE-COATED CUTTING TOOL

RELATED APPLICATIONS

This application is the U.S. National Phase under 35 U.S.C. §371 of International Application No. PCT/JP2005/020995, filed on Nov. 16, 2005, which in turn claims the benefit of Japanese Application No. 2004-377489, filed on Dec. 27, 2004, the disclosures of which Applications are incorporated by reference herein.

TECHNICAL FIELD

The present invention relates to a cutting tool such as a drill, an end mill, an indexable insert for a drill, an indexable insert for an end mill, an indexable insert for milling, an indexable insert for turning, a metal saw, a gear cutting tool, a reamer or a tap, and more particularly, it relates to a surface-coated cutting tool provided with a coating improving characteristics such as toughness and wear resistance on the surface thereof.

BACKGROUND ART

In general, cemented carbide (a WC—Co alloy or an alloy prepared by adding a carbonitride of Ti (titanium), Ta (tantalum) or Nb (niobium) thereto) has been employed for a tool for cutting. Following the recent speed increase in cutting, however, the usage of a hard alloy tool comprising a substrate of cemented carbide, cermet, a cubic boron nitride sintered body or alumina- or silicon nitride-based ceramics covered with at least one coating layer of a compound composed of at least one first element selected from group IVa elements, group Va elements and group VIa elements of the periodic table of elements, Al (aluminum), Si and B and at least one second element selected from B, C, N and O (if the first element is only B, the second element is not B) on the surface thereof by CVD (Chemical Vapor Deposition) or PVD (Physical Vapor Deposition) with the coating layer having a thickness of 3 to 20 μm increases.

Such a cutting tool has a rake face coming into contact with chips of a workpiece and a flank face coming into contact with the workpiece itself, and a portion corresponding to an edge where the rake face and the flank face intersect with each other (and a portion around the same) is referred to as an insert edge.

In recent years, the cutting speed has been further increased in order to further improve cutting machinability, to require higher wear resistance to such a cutting tool. However, the requirement for high wear resistance leads to reduction of toughness, and hence compatibility between high wear resistance and high toughness is required.

As an attempt to satisfy this requirement, Japanese Patent Laying-Open No. 05-177411 (Patent Document 1), for example, pays attention to residual tensile stress of a coating layer caused when the coating layer is formed on a substrate at a high temperature by chemical vapor deposition (CVD) and thereafter cooled to the room temperature, assumes that this tensile stress reduces toughness of a tool and proposes a measure for solving this problem. While this tensile stress results from the difference between the thermal expansion coefficients of the substrate and the coating layer, a technique of first forming a first coating layer having such tensile stress on the substrate, forming prescribed cracking on this first coating layer and thereafter forming a second coating layer having compressive stress on the first coating layer thereby improving toughness (fracture resistance) while maintaining high wear resistance is employed.

Japanese Patent Laying-Open No. 05-177412 (Patent Document 2), paying attention to tensile stress of a coating layer similarly to the above, employs an approach different from the above and proposes a structure obtained by forming an inner coating layer having tensile stress on a hard ceramics substrate and forming an outer coating layer having compressive stress thereon. Further, Japanese Patent Laying-Open No. 05-177413 (Patent Document 3) proposes a cutting tool, comprising a substrate of cermet, having a structure similar to that of Patent Document 2.

On the other hand, Japanese Patent Laying-Open No. 06-055311 (Patent Document 4) proposes a cutting tool prepared by forming a hard coating layer on a substrate of cemented carbide by chemical vapor deposition and substantially removing tensile stress from a rake face portion of the hard coating layer while holding tensile stress of a flank face portion of the hard coating layer.

Japanese Patent No. 3087465 (Japanese Patent Laying-Open No. 06-079502, Patent Document 5) proposes a cutting tool prepared by forming a hard coating layer having a substantially identical compressive stress distribution along the overall insert edge on the surface of a titanium carbonitride-based cermet substrate and performing shotblasting on this hard coating layer thereby rendering compressive stress of a rake face portion greater than compressive stress of a flank face portion by at least 49 MPa.

While toughness and wear resistance can be rendered compatible to some extent in each of the aforementioned proposals, however, higher performance is required to a cutting tool under the present circumstances around the cutting tool, and development of a cutting tool sufficiently satisfying such performance is demanded.

Patent Document 1: Japanese Patent Laying-Open No. 05-177411
Patent Document 2: Japanese Patent Laying-Open No. 05-177412
Patent Document 3: Japanese Patent Laying-Open No. 05-177413
Patent Document 4: Japanese Patent Laying-Open No. 06-055311
Patent Document 5: Japanese Patent No. 3087465 (Japanese Patent Laying-Open No. 06-079502)

DISCLOSURE OF THE INVENTION

Problems to be Solved by the Invention

The present invention has been proposed in consideration of the aforementioned circumstances, and an object thereof is to provide a surface-coated cutting tool having toughness and wear resistance highly compatible with each other.

Means for Solving the Problems

The inventor has made deep studies for solving the aforementioned problem, to recognize that it is most effective for compatibleness between toughness and wear resistance to select a specific material for a coating covering a substrate, to pay attention not to stress in units of layers in a case of covering the substrate with a plurality of layers but to stress control in units of faces such as a rake face and a flank face and to apply specific stress to the rake face and the flank face, and finally completed the present invention by making further studies on the basis of this recognition.

The present invention relates to a surface-coated cutting tool comprising a substrate and a coating formed on this substrate, characterized in that the coating includes a first coating containing TiCN and a second coating containing α-type $Al_2O_3$, the first coating is located between the aforementioned substrate and the aforementioned second coating, and the second coating has compressive stress S1 on a rake face and tensile stress S2 on a flank face, with the compressive stress S1 and the tensile stress S2 defined by the following expression (I):

$$441 \text{ MPa} \leq |S1 - S2| \leq 3500 \text{ MPa} \quad \text{(I)}$$

The aforementioned first coating can have tensile stress, or can be released from tensile stress to substantially have no stress.

The aforementioned first coating can have tensile stress SS1 on the rake face and tensile stress SS2 on the flank face, with the tensile stress SS1 and the tensile stress SS2 defined by the following expression (II):

$$0 \leq |SS1 - SS2| \leq 500 \text{ MPa} \quad \text{(II)}$$

The aforementioned surface-coated cutting tool can have surface roughness defined by the following expression (III) assuming that "A" represents the increasing surface area ratio of the rake face thereof and "B" represents the increasing surface area ratio of the flank face thereof:

$$0.05 \leq A/B \leq 0.50 \quad \text{(III)}$$

The aforementioned first coating can further contain oxygen, and can contain at least one element selected from a group consisting of group IVa elements, group Va elements and group VIa elements of the periodic table of elements, Si, Y, B and S. Further, the aforementioned second coating can further contain at least one element selected from a group consisting of group IVa elements, group Va elements and group VIa elements of the periodic table of elements, Si, Y, B and S.

The aforementioned first coating can have a columnar structure with an aspect ratio of at least 3 and a crystal structure with an average grain size of at least 0.05 μm and not more than 1.5 μm. Further, the aforementioned first coating can have a thickness of 2 to 20 μm, and the aforementioned second coating can have a thickness of 0.5 to 20 μm.

EFFECTS OF THE INVENTION

The surface-coated cutting tool according to the present invention has the aforementioned structure, thereby rendering toughness and wear resistance highly compatible with each other.

Figure 1:
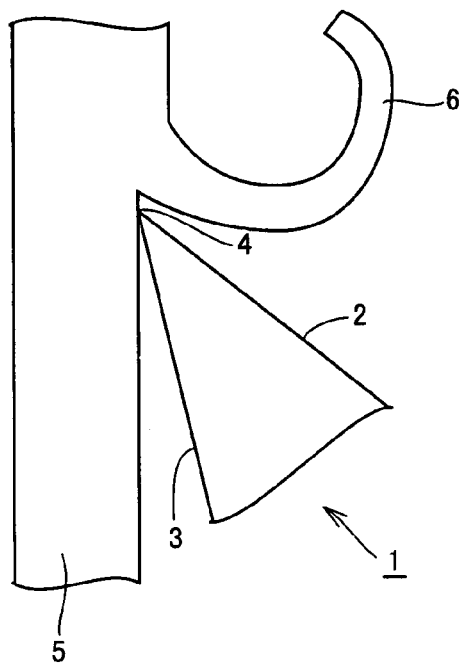
FIG. 1 is a schematic diagram typically showing a contact state between a surface-coated cutting tool and a workpiece in cutting.

DESCRIPTION OF REFERENCE NUMERALS 1 surface-coated cutting tool, 2 rake face, 3 flank face, 4 insert edge, 5 workpiece, 6 chip, 7 through-hole, 8 substrate, 9 coating, 10 first coating, 11 second coating.

BEST MODES FOR CARRYING OUT THE INVENTION

The present invention is now described in further detail. While the following embodiment is described with reference to the drawings, identical reference numerals denote the same or corresponding portions in the drawings of the present invention.

<Surface-Coated Cutting Tool>

The surface-coated cutting tool according to the present invention has a structure comprising a substrate and a coating formed on this substrate.

As shown in FIG. 1, this surface-coated cutting tool 1 has a rake face 2 coming into contact with a chip 6 of a workpiece 5 in cutting and a flank face 3 coming into contact with the workpiece itself, and a portion corresponding to an edge where this rake face 2 and flank face 3 intersect with each other is referred to as an insert edge 4 serving as a central point of action cutting workpiece 5. The terms rake face and flank face employed in the present invention are concepts including not only faces located on the surfaces of the surface-coated cutting tool but also corresponding faces located in a coating.

According to a study by the inventor, it has been proved that the workpiece first comes into contact with the aforementioned rake face 2 in cutting and an impact resulting from this first contact remarkably influences toughness of rake face 2 while rake face 2 is exposed to a considerably high temperature due to heat generated by this impact. This phenomenon is particularly remarkable in an interrupted cutting step repetitively causing cutting and contact. Therefore, it is important to apply measures against these phenomena to rake face 2, and the present invention certainly provides effective measures therefor.

Such a surface-coated cutting tool can be employed as a drill, an end mill, an indexable insert for a drill, an indexable insert for an end mill, an indexable insert for milling, an indexable insert for turning, a metal saw, a gear cutting tool, a reamer or a tap, for example.

Figure 2:
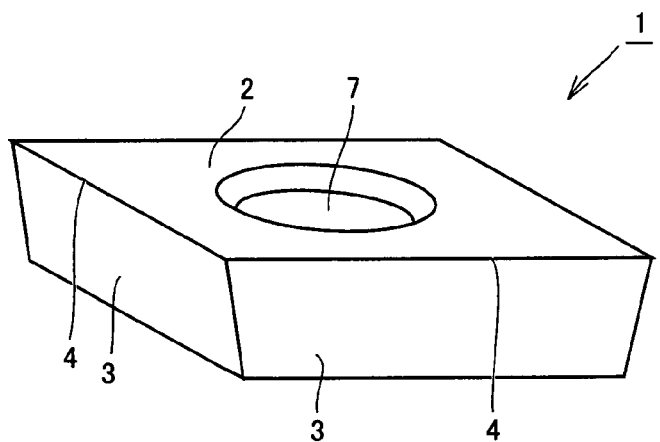
FIG. 2 is a schematic perspective view of the surface-coated cutting tool.

When this surface-coated cutting tool 1 is an indexable insert, for example, a through-hole 7 can be provided on the center thereof as shown in FIG. 2, so that the cutting tool is mountable on a tool body. As to such through-hole 7, another fixing means can be provided in addition to or in place of this through-hole if necessary.

<Substrate>

As the aforementioned substrate, a generally well-known one known as a substrate for such a cutting tool can be used with no particular limitation. For example, cemented carbide (including WC-based cemented carbide WC, and that containing Co in addition to WC or further containing a carbonitride of Ti, Ta or Nb, for example), cermet (mainly composed of TiC, TiN, TiCN or the like), high-speed steel, ceramics (titanium carbide, silicon carbide, silicon nitride, aluminum nitride, aluminum oxide or the like), a cubic boron nitride sintered body, a diamond sintered body, a silicon nitride sintered body or a mixture of aluminum oxide and titanium carbide can be listed as such a substrate.

Among such various substrates, cemented carbide (WC-based cemented carbide) is preferably employed particularly in the present invention. This is because cemented carbide containing a ferrous metal such as cobalt in addition to the main body of hard tungsten carbide is an alloy extremely balanced as the substrate for a cutting tool having high hardness as well as high strength.

<Coating>

Figure 3:
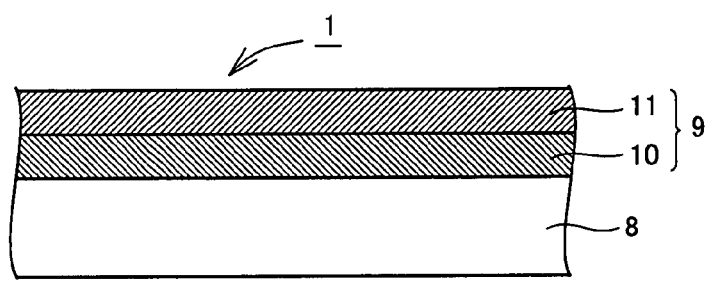
FIG. 3 is a schematic sectional view of the surface-coated cutting tool.

A coating 9 formed on the aforementioned substrate 8 as shown in FIG. 3 is mainly so formed as to further improve toughness and further improve wear resistance, and includes a first coating 10 containing TiCN and a second coating 11 containing α-type Al$_2$O$_3$.

This coating can include a third coating in addition to the aforementioned first coating and the aforementioned second coating, in order to further improve adhesiveness between the coating and the substrate, further improve adhesiveness between the first and second coatings or to improve the state of the surface of the coating.

As such a third coating, TiN, TiC, TiCO, TiBN, ZrCN, TiZrCN, AlN, AlON, TiAlN or the like, for example, can be listed.

One or at least two such third coatings can be formed with no particular limitation in the mode of stacking thereof, and can be formed on at least one arbitrary stacking portion between the substrate and the first coating, between the first and second coatings or on the surface of the second coating, for example.

While the first and second coatings are now described, the second coating is first described for the convenience of illustration.

<Second Coating>

The second coating according to the present invention is composed of α-type Al$_2$O$_3$. The second coating constituted of this material is so formed on the outermost surface of the substrate or in the vicinity of the outermost surface that the substrate can be effectively prevented from oxidation and the components of the workpiece can be remarkably effectively prevented from diffusing toward the substrate in cutting. While such oxidation and diffusion are prompted by heat generation in cutting, α-type Al$_2$O$_3$ is excellent in high-temperature stability, to exhibit a remarkably excellent effect due to synergetic action of these effects.

This second coating may be composed of only α-type Al$_2$O$_3$, or may contain at least one element selected from a group consisting of group IVa elements (Ti, Zr, Hf etc.), group Va elements (V, Nb, Ta etc.), group VIa elements (Cr, Mo, W etc.) of the periodic table of elements, Si, Y, B and S. The mode of containing of such an element is not restricted but such an element may occupy a normal position of the crystal lattice of the aforementioned α-type Al$_2$O$_3$ as a substitutional element, may enter the crystal lattice as an interstitial element, may form an intermetallic compound, or may exist as an amorphous element.

Any concentration distribution of such an element may be adopted. For example, the element may be homogeneously distributed in the coating, may be distributed in a high or low concentration in crystal grain boundaries, or may be distributed in a high or low concentration on a surface portion of the coating. As to the concentration, further, this element is preferably contained by 0.01 to 30 atomic % with respect to Al of α-type Al$_2$O$_3$, more preferably with an upper limit of 20 atomic %, further preferably 10 atomic %, and with a lower limit of 0.05 atomic %, further preferably 0.1 atomic %. The second coating may not exhibit an effect (effect showing high hardness or high strength under a high temperature or supplied with excellent lubricity, for example) resulting from this element if the content thereof is less than 0.01 atomic %, while the crystal lattice of the second coating may be distorted to reduce the hardness or the strength if the content exceeds 30 atomic %.

Such a second coating is preferably formed with a thickness of 0.5 to 20 μm, more preferably with an upper limit of 10 μm, further preferably 5 μm, and with a lower limit of 1 μm, further preferably 1.5 μm. Chemical stability of the second coating itself may be so damaged as to forward the progress of wear such as adhesive wear or diffusive wear if the thickness is less than 0.5 μm, while the strength of the coating may be so damaged as to cause separation or chipping of the coating and finally lead to fracture if the thickness exceeds 20 μm.

This second coating has compressive stress S1 on the rake face and tensile stress S2 on the flank face, with the compressive stress S1 and the tensile stress S2 defined by the following expression (I):

$$441 \text{ MPa} \leq |S1-S2| \leq 3500 \text{ MPa} \quad (I)$$

As hereinabove described, the rake-face is the portion first coming into contact with the workpiece in cutting and also a portion exposed to a high temperature, and hence toughness can be remarkably effectively improved by employing compressive stress S1 as the stress on this portion. The compressive stress is a kind of internal stress (specific distortion) present in the coating, expressed in a numerical value (unit: MPa) of "−" (minus). Therefore, such a concept that the compressive stress is large indicates that the absolute value of the aforementioned numerical value is increased, and such a concept that the compressive stress is small indicates that the absolute value of the aforementioned numerical value is reduced.

This compressive stress S1 particularly preferably has compressive stress (|S1|>441 MPa) greater than 441 MPa (45 kg/mm$^2$). Thus, sufficient toughness can be obtained under substantially ordinary working conditions.

In this second coating, the tensile stress S2 is employed as the stress on the flank face, thereby attempting maintenance of wear resistance and preventing the coating itself from separation. The tensile stress is also a kind of internal stress (specific distortion) present in the coating, expressed in a numerical value (unit: MPa) of "+" (plus). Therefore, such a concept that the tensile stress is large indicates that the aforementioned numerical value is increased, and such a concept that the tensile stress is small indicates that the aforementioned numerical value is reduced. This tensile stress S2 of the flank face generally has a value of 50 MPa to 300 MPa if the substrate is prepared from cemented carbide.

Further, the second coating according to the present invention is characterized in that the aforementioned compressive stress S1 and the aforementioned tensile stress S2 are defined by the above expression (I). More preferably, 500 MPa≦|S1−S2|≦3000 MPa.

Thus, it has been rendered possible to attain compatibility between toughness and wear resistance at a particularly high level. While the action of improving the toughness cannot be sufficiently attained if the absolute value (|S1−S2|) of the difference between the compressive stress S1 and the tensile stress S2 is less than 441 MPa (45 kg/mm$^2$) in the above, this second coating may separate from the substrate if the absolute value exceeds 3500 MPa.

While a method of forming the aforementioned stress distribution is not particularly restricted in the second coating according to the present invention, a desired stress distribution can be formed by forming a coating of α-type Al$_2$O$_3$ by well-known chemical vapor deposition (CVD) and supplying compressive stress to a rake face portion of this coating generally having tensile stress by a technique such as brushing, blasting (including sandblasting or wet blasting, for example), shot peening or bombardment of PVD, for example.

On the other hand, such a coating of α-type Al$_2$O$_3$ can alternatively be formed by well-known physical vapor deposition (PVD) and this coating generally has compressive stress in this case, and hence a method performing treatment according to a technique such as heat treatment, lasing or high-frequency treatment on a flank face portion of this coating thereby releasing this portion from the compressive stress and supplying tensile stress can also be employed.

Such a stress distribution can be measured by a $\sin^2 \psi$ method with an X-ray stress measuring apparatus, by selecting the (116) plane of α-type $Al_2O_3$ as the measured diffraction plane. The aforementioned rake face and the flank face have prescribed areas respectively, whereby each of the aforementioned compressive stress S1 and the aforementioned tensile stress S2 can be measured by measuring stress levels on arbitrary 10 points (these points are preferably selected at distances of at least 0.5 mm from each other to be capable of representing the stress on each surface) included in each surface by this method and obtaining the average thereof.

Such a $\sin^2 \psi$ method employing X-rays is widely employed as the method of measuring residual stress of a polycrystalline material, and a method described in "X-Ray Stress Measuring Method" (The Society of Materials Science, Japan, issued by Kabushiki Kaisha Yokendo in 1981), pp. 54 to 66 in detail may be employed.

In order to obtain the stress distribution from a $2\theta-\sin^2 \psi$ diagram as described above, the Young's modulus and the Poisson's ratio of the coating are necessary. However, the Young's modulus can be measured with a dynamic hardness meter or the like, while a value of about 0.2 can be employed as the Poisson's ratio not remarkably varying with the material. According to the present invention, a correct stress value is not particularly important but stress difference is important. When obtaining the stress difference from the $2\theta-\sin^2 \psi$ diagram, therefore, the lattice constant and the lattice spacing may be obtained for substituting for the stress distribution without employing the Young's modulus.

Also when the second coating according to the present invention contains at least one element selected from the group consisting of group IVa elements, group Va elements and group VIa elements of the periodic table of elements, Si, Y, B and S as hereinabove described, the (116) plane is present on a substantially equivalent position of 2θ and hence stress can be measured similarly to the above.

<First Coating>

The first coating according to the present invention is located between the aforementioned substrate and the aforementioned second coating, and composed of TiCN. The second coating composed of the aforementioned α-type $Al_2O_3$, having the aforementioned excellent effect, is relatively fragile, and hence higher wear resistance may be required in such application under a relatively low cutting temperature that abrasive wear resistance is regarded as particularly important. The first coating according to the present invention is formed in order to certainly satisfy such requirement, has extremely high hardness although the first coating itself is easily oxidized through cutting under a high temperature, and is located between the aforementioned second coating and the substrate thereby exhibiting a function of remarkably improving wear resistance.

This first coating may be composed of only TiCN, or may further contain oxygen. The mode of containing of such oxygen is not restricted but any mode may be adopted. For example, oxygen may occupy a normal position of the crystal lattice of the aforementioned TiCN as a substitutional element, may enter the crystal lattice as an interstitial element, or may exist as an amorphous element.

The first coating may contain oxygen as above and may also contain at least one element selected from a group consisting of group IVa elements, group Va elements and group VIa elements of the periodic table of elements, Si, Y, B and S. These elements may be contained along with oxygen or singularly contained without oxygen, and can be contained in any mode similarly to the aforementioned oxygen.

Thus, the first coating may be composed of only TiCN, or can alternatively be mainly composed of TiCN while containing the aforementioned elements such as oxygen.

Any concentration distribution of the element such as oxygen may be adopted. For example, the element may be homogeneously distributed in the coating, may be distributed in a high or low concentration in crystal grain boundaries, or may be distributed in a high or low concentration on a surface portion of the coating. As to the concentration, further, this element such as oxygen is preferably contained by 0.1 to 40 atomic % with respect to the sum of C and N in TiCN, more preferably with an upper limit of 30 atomic %, further preferably 20 atomic %, and with a lower limit of 1 atomic %, further preferably 5 atomic %. The first coating may not exhibit an effect (refinement of crystal grains, for example) resulting from the element such as oxygen if the content thereof is less than 0.1 atomic %, while the crystal lattice of the coating may be distorted to reduce the hardness or the strength if the content exceeds 40 atomic %.

Such a first coating is preferably formed with a thickness of 2 to 20 μm, more preferably with an upper limit of 15 μm, further preferably 10 μm, and with a lower limit of 2.5 μm, further preferably 3 μm. Wear may so progress to expose the substrate that the wear further remarkably progresses if the thickness is less than 2 μm, while the strength of the coating may be so damaged as to cause separation or chipping of the coating and finally lead to fracture if the thickness exceeds 20 μm.

Further, such a first coating preferably has a columnar structure with an aspect ratio of at least 3 and a crystal structure with an average grain size of at least 0.05 μm and not more than 1.5 μm. Abrasive wear resistance can be further improved due to this crystal structure. The aspect ratio denotes a numerical value obtained by measuring the average grain size of crystals contained in the first coating by the following method and dividing the thickness of the first coating by this average grain size. This average grain size can be measured by mirror-finishing a section of this first coating while etching crystal boundaries, thereafter measuring the widths of the respective crystals (widths of the respective crystals in a direction perpendicular to the direction of the thickness) at a point half the thickness of this first coating and regarding the average of the widths as the average grain size.

If this aspect ratio is less than 3, abrasive wear resistance may not be improvable. While abrasive wear resistance is improved as the numerical value of this aspect ratio is increased and hence the upper limit thereof may not be particularly defined, the crystals may be excessively refined to embrittle the structure and deteriorate chipping resistance if the aspect ratio exceeds 300. The aspect ratio is more preferably 7 to 200, further preferably with an upper limit of 100, particularly preferably 50, and with a lower limit of 15, particularly preferably 20.

If the average grain size is less than 0.05 μm, the crystals may be excessively refined to embrittle the structure and deteriorate chipping resistance. If the average grain size exceeds 1.5 μm, the structure of the crystals may be roughened to deteriorate irregularity of the surface and deteriorate cutting resistance such as a flow of chips. The average grain size is more preferably at least 0.1 μm and not more than 1 μm, further preferably with an upper limit of 0.6 μm, particularly preferably 0.4 μm, and with a lower limit of 0.15 μm, particularly preferably 0.2 μm.

Such a first coating preferably has tensile stress, or is preferably released from tensile stress to substantially have no stress. The first coating having such stress can attain high adhesiveness between the same and the substrate, and can implement particularly excellent wear resistance. If the substrate is prepared from cemented carbide, such tensile stress generally has a value of 50 MPa to 300 MPa.

Further, such a first coating preferably has tensile stress SS1 on the rake face and tensile stress SS2 on the flank face, with the tensile stress SS1 and the tensile stress SS2 defined by the following expression (II):

$$0 \leq |SS1-SS2| \leq 500 \text{ MPa} \quad \text{(II)}$$

The rake face and the flank face denote the same regions as those of the aforementioned second coating. Such provision that the absolute value (|SS1−SS2|) of the difference between the tensile stress SS1 and the tensile stress SS2 is within the range expressed in the above expression (II) indicates that influence by treatment performed on the rake face (or treatment performed on the flank face) for providing the aforementioned second coating with the aforementioned prescribed stress distribution is preferably substantially not transmitted to this first coating. In other words, the first coating may not substantially have a stress distribution such as that of the second coating. If the absolute value (|SS1−SS2|) of the difference between the tensile stress SS1 and the tensile stress SS2 exceeds 500 MPa to the contrary, adhesiveness to the underlayer may be damaged to cause separation or chipping of the coating and finally lead to fracture. The upper limit of the absolute value (|SS1−SS2|) of the difference between the tensile stress SS1 and the tensile stress SS2 is more preferably 200 MPa, further preferably 100 MPa.

Such a first coating can be formed by well-known CVD. Thus, tensile stress can simultaneously be supplied to the first coating. Alternatively, such a first coating can be formed by well-known PVD, and this coating generally has compressive stress in this case. In order to convert such compressive stress to tensile stress, or in order to release the first coating from tensile stress to substantially have no stress, therefore, treatment according to a technique such as heat treatment, lasing or high-frequency treatment is preferably performed on this first coating.

The stress of such a first coating can be measured similarly to the case of the aforementioned second coating by a $\sin^2 \psi$ method with an X-ray stress measuring apparatus, by selecting the (422) plane of TiCN as the measured diffraction plane. Also when the first coating according to the present invention further contains the element such as oxygen as described above, the (422) plane is present on a substantially equivalent position of 2θ and hence stress can be measured similarly to the above.

<Surface Roughness>

The surface-coated cutting tool according to the present invention preferably has surface roughness defined by the following expression (III), assuming that "A" represents the increasing surface area ratio of the rake face thereof and "B" represents the increasing surface area ratio of the flank face thereof:

$$0.05 \leq A/B \leq 0.50 \quad \text{(III)}$$

The increasing surface area ratio defines the surface roughness of the coating surface from a three-dimensional point of view, and has a concept absolutely different from conventional surface roughness Ra or Rmax defining two-dimensional surface roughness only in the vertical direction. In other words, this increasing surface area ratio is expressed in (a1/a2)−1 obtained by subtracting 1 from the ratio a1/a2 between the total surface area a1 inclusive of vertical and horizontal omnidirectional irregularities included in a prescribed measuring field and the two-dimensional area a2 of this measuring field. As the value of this increasing surface area ratio is reduced, smoothness is improved. More specifically, such an increasing surface area ratio can be obtained from a value measured with an electron beam 3D roughness analyzer (ERA-8000 or the like) by Elionix Co., Ltd. For example, the increasing surface area ratio can be measured by measuring the surface of the coating while setting the magnification to 5000 times for eliminating macroscopic undulation on the coating surface and rendering fine irregularities measurable and setting sampling numbers in the horizontal and vertical directions in the measuring field to 280 and 210 respectively on the rake face and the flank face. The increasing surface area ratio can alternatively be measured with another apparatus, if the apparatus can measure the increasing surface area ratio with a principle similar to the above.

Assuming that "A" represents this increasing surface area ratio of the rake face measured in the aforementioned manner and "B" represents the increasing surface area ratio of the flank face, the A/B value is preferably defined by the aforementioned expression (III). When the A/B value exhibits a numerical value within the range defined by the expression (III), smoothness of the rake face is so particularly improved that dischargeability for chips in cutting is particularly improved for exhibiting an effect of inhibiting the rake face from temperature rise. This is conceivably because chips reaching a high temperature are so excellently discharged in cutting that the rake face is consequently inhibited from temperature rise.

The dischargeability for chips is so inferior that the aforementioned effect cannot be expected if the aforementioned A/B value exceeds 0.50, while the aforementioned effect is not particularly improved but smoothing requires a high cost to result in economic inconvenience if the A/B value is less than 0.05.

In order to supply the surface roughness defined by the expression (III) to the surface-coated cutting tool according to the present invention, well-known polishing or smoothing is preferably performed on the surface, particularly on the rake face. For example, buffing, brushing, barreling, diamond lapping or blasting can be listed as such treatment.

EXAMPLES

While the present invention is now described in more detail with reference to Examples, the present invention is not restricted to these.

Examples 1 to 5 and Comparative Examples 1 to 4

Powders of 86 mass % of WC, 8.0 mass % of Co, 2.0 mass % of TiC, 2.0 mass % of NbC and 2.0 mass % of ZrC were wet-mixed with each other in a ball mill for 72 hours. Then, this mixture was dried and thereafter press-molded. Thereafter the mixture was sintered in a vacuum atmosphere under conditions of 1420° C. and 1 hour.

An insert edge of the obtained sintered body was chamfered by SiC brush horning, thereby preparing a substrate for a WC-based cemented carbide throwaway cutting tool having a tip shape of ISO•SNMG120408.

A coating having the following structure was formed on the surface of this substrate by well-known thermal CVD, which is chemical vapor deposition. A surface-coated cutting tool comprising a substrate and a coating formed on this substrate was prepared by forming a TiN film of 0.5 µm in thickness on the substrate, forming a TiCN film of 7.0 µm in thickness serving as a first coating thereon, forming a TiN film of 0.5 µm in thickness thereon, forming an α-type Al$_2$O$_3$ film of 3.0 μm in thickness serving as a second coating thereon and forming a TiN film of 0.5 μm in thickness thereon. This coating included the first coating containing TiCN and the second coating containing α-type Al$_2$O$_3$ as described above, and the first coating was located between the substrate and the second coating.

Then, wet blasting with ceramic abrasive grains of Al$_2$O$_3$ or the like having particle diameters of not more than 250 μm was performed on the overall rake face of the surface-coated cutting tool prepared in the aforementioned manner under conditions of a projection pressure of 0.01 to 0.5 MPa, a projection distance of 0.5 to 200 mm and a dust concentration of 5 to 40 vol. %, thereby preparing surface-coated cutting tools according to Examples 1 to 5 and comparative examples 1 to 4 having stress distributions (|S1−S2| values in the respective second coatings and |SS1−SS2| values in the respective first coatings) shown in Table 1. Each of such surface-coated cutting tools according to Examples 1 to 5 of the present invention had compressive stress S1 on a rake face of the second coating and tensile stress S2 on a flank face, while the first coating had tensile stress or was released from tensile stress to substantially have no stress.

The aforementioned stress distributions (|S1−S2| values in the respective second coatings and |SS1−SS2| values in the respective first coatings) of the respective Examples and comparative examples were formed by properly adjusting the conditions of the aforementioned wet blasting in the aforementioned numerical range, and the stress distributions (|S1−S2| values in the respective second coatings and |SS1−SS2| values in the respective first coatings) were measured by the aforementioned sin$^2$ ψ method.

The first coatings of the surface-coated cutting tools according to Examples 1 to 5 measured by the aforementioned method had columnar structures with aspect ratios of 30 and crystal structures exhibiting average grain sizes of 0.23 μm.

A turning/cutting test was conducted on these surface-coated cutting tools under the following conditions, for measuring times up to fracture. Toughness and wear resistance are improved as the time up to fracture is increased.

<Test Conditions>
Workpiece: slotted round bar of SCM435
Cutting Speed: 230 m/min
Feed Rate: 0.15 mm/rev.
Depth of Cut: 1.0 mm
Cutting Oil: none

TABLE 1

|  | |S1 − S2| Value of Second Coating | |SS1 − SS2| Value of First Coating | Time up to Fracture |
|---|---|---|---|
| Example 1 | 460 MPa | 10 MPa | 14.7 min. |
| Example 2 | 1000 MPa | 40 MPa | 17.5 min. |
| Example 3 | 1500 MPa | 0 MPa | 16.5 min. |
| Example 4 | 1500 MPa | 130 MPa | 18.0 min. |
| Example 5 | 3450 MPa | 400 MPa | 19.5 min. |
| Comparative Example 1 | 0 MPa | 0 MPa | 1.0 min. |
| Comparative Example 2 | 50 MPa | 30 MPa | 1.9 min. |
| Comparative Example 3 | 400 MPa | 0 MPa | 3.0 min. |
| Comparative Example 4 | 4000 MPa | 30 MPa | 5.0 min. |

As obvious from Table 1, the surface-coated cutting tools (Examples 1 to 5) having the second coatings exhibiting the absolute values (|S1−S2|) of the difference between the compressive stress S1 and the tensile stress S2 in the above expression (I) in the range of at least 441 MPa and not more than 3500 MPa highly attained compatibleness between toughness and wear resistance as compared with the surface-coated cutting tools (comparative examples 1 to 4) exhibiting the absolute values of the difference out of this range.

When the increasing surface area ratios "A" of the rake faces and the increasing surface area ratios "B" of the flank faces were measured with an electron beam 3D roughness analyzer (ERA-8000 by Elionix Co., Ltd) as to the respective ones of the surface-coated cutting tools according to Examples 1 to 5, the surface-coated cutting tools according to Examples 1, 2, 3, 4 and 5 exhibited A/B values of 0.61, 0.49, 0.41, 0.43 and 0.45 respectively.

Examples 6 to 10

The following smoothing was performed on the rake faces of the respective ones of the surface-coated cutting tools according to Examples 1 to 5 (Example 1 corresponds to Example 6, and the remaining ones also have sequential correspondence).

This smoothing was executed by using diamond abrasive grains of different grain sizes (#400 to #4000) and employing different lapping times for the rake faces of the respective ones of the surface-coated cutting tools as shown in Table 2.

Thereafter the increasing surface area ratios "A" of the rake faces and the increasing surface area ratios "B" of the flank faces were measured with an electron beam 3D roughness analyzer (ERA-8000 by Elionix Co., Ltd) as to the respective ones of the surface-coated cutting tools subjected to this smoothing, to obtain A/B values shown in Table 2.

A turning/cutting test was conducted on these surface-coated cutting tools under conditions similar to the above, for measuring times up to fracture. Toughness and wear resistance are improved as the time up to fracture is increased. Table 2 shows the results.

TABLE 2

|  | Grain Size of Diamond Abrasive | Lapping Time | A/B | Time up to Fracture |
|---|---|---|---|---|
| Example 6 | #1200 | 15 min. | 0.48 | 18.2 min. |
| Example 7 | #1000 | 15 min. | 0.35 | 22.0 min. |
| Example 8 | #400 | 5 min. | 0.37 | 24.9 min. |
| Example 9 | #3000 | 60 min. | 0.13 | 32.2 min. |
| Example 10 | #4000 | 60 min. | 0.05 | 37.0 min. |

As obvious from Tables 1 and 2, the surface-coated cutting tools (Examples 2 to 10) having A/B values of at least 0.05 and not more than 0.50 exhibited much superior toughness and wear resistance as compared with Example 1 (A/B: 0.61), and by far superior toughness and wear resistance were exhibited as the A/B value was reduced in particular.

The embodiment and Examples disclosed this time must be considered as illustrative in all points and not restrictive. The range of the present invention is shown not by the above description but by the scope of claim for patent, and it is intended that all modifications within the meaning and range equivalent to the scope of claim for patent are included.

The invention claimed is:
1. A surface-coated cutting tool comprising:
a substrate; and
a coating formed on said substrate, wherein
said coating includes a first coating containing TiCN and a second coating containing α-type Al$_2$O$_3$, said first coating is located between said substrate and said second coating and has tensile stress, or is released from tensile stress to substantially have no stress, and said second coating has compressive stress S1 on a rake face and tensile stress S2 on a flank face, with said compressive stress S1 and said tensile stress S2 defined by the following expressions (I) and (I)':

$$441 \text{ MPa} \leq |S1-S2| \leq 3500 \text{ MPa} \tag{I}$$

$$|S1| > 441 \text{ MPa} \tag{I}'$$

2. The surface-coated cutting tool according to claim 1, wherein said first coating has tensile stress SS1 on the rake face and tensile stress SS2 on the flank face, with said tensile stress SS1 and said tensile stress SS2 defined by the following expression (II):

$$0 \leq |SS1-SS2| \leq 500 \text{ MPa} \tag{II}$$

3. The surface-coated cutting tool according to claim 1, wherein said surface-coated cutting tool has surface roughness defined by the following expression (III) assuming that "A" represents the increasing surface area ratio of the rake face thereof and "B" represents the increasing surface area ratio of the flank face thereof:

$$0.05 \leq A/B \leq 0.50 \tag{III}$$

4. The surface-coated cutting tool according to claim 1, wherein said first coating further contains oxygen.

5. The surface-coated cutting tool according to claim 1, wherein said first coating further contains at least one element selected from a group consisting of group IVa elements, group Va elements and group VIa elements of the periodic table of elements, Si, Y, B and S.

6. The surface-coated cutting tool according to claim 1, wherein said second coating further contains at least one element selected from a group consisting of group IVa elements, group Va elements and group VIa elements of the periodic table of elements, Si, Y, B and S.

7. The surface-coated cutting tool according to claim 1, wherein said first coating has a columnar structure with an aspect ratio of at least 3 and a crystal structure with an average grain size of at least 0.05 µm and not more than 1.5 µm.

8. The surface-coated cutting tool according to claim 1, wherein said first coating has a thickness of 2 to 20 µm, and said second coating has a thickness of 0.5 to 20 µm.

* * * * *